United States Patent
Ye et al.

(10) Patent No.: US 8,228,124 B2
(45) Date of Patent: *Jul. 24, 2012

(54) HEADPHONE AMPLIFIER CIRCUIT

(75) Inventors: Jinghua Ye, Shanghai (CN); Hui Shen, Shanghai (CN); Danny Li, Shanghai (CN)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/983,412

(22) Filed: Jan. 3, 2011

(65) Prior Publication Data

US 2011/0095829 A1    Apr. 28, 2011

Related U.S. Application Data

(63) Continuation of application No. 12/255,537, filed on Oct. 21, 2008, now Pat. No. 7,880,548.

(51) Int. Cl.
*H03F 3/04* (2006.01)
(52) U.S. Cl. .......................... 330/297; 330/296
(58) Field of Classification Search .................. 330/297, 330/285, 296, 129, 136
See application file for complete search history.

(56) References Cited

U.S. PATENT DOCUMENTS

| | | | |
|---|---|---|---|
| 3,486,128 A | 12/1969 | Lohrmann | |
| 3,900,823 A | 8/1975 | Sokal et al. | |
| 6,586,992 B1 | 7/2003 | Strakovsky | |
| 6,825,726 B2 | 11/2004 | French et al. | |
| 7,061,327 B2 | 6/2006 | Doy | |
| 7,193,470 B2* | 3/2007 | Lee et al. | 330/285 |
| 7,417,503 B2* | 8/2008 | Xu et al. | 330/207 A |
| 7,466,195 B2 | 12/2008 | Drogi et al. | |
| 2008/0116979 A1 | 5/2008 | Lesso et al. | |

FOREIGN PATENT DOCUMENTS

WO    WO 2007/082388    7/2007
WO    WO 2008/089182    7/2008

* cited by examiner

*Primary Examiner* — Henry Choe
(74) *Attorney, Agent, or Firm* — Kenyon & Kenyon LLP

(57) ABSTRACT

A class G headphone amplifier circuit with improved power efficiency and low EMI. It may use an automatic signal level detector to detect the signal level of incoming signals and determine positive and negative power supplies for headphone amplifiers accordingly. A voltage generator may generate pairs of differential output voltages at a plurality of amplitude steps, and supply to headphone amplifiers the pair with the amplitude determined by the automatic signal level detector. As a result, headphone amplifiers are biased according to the input signal level, and the multiple voltage rails may improve power efficiency and avoid clipping.

12 Claims, 18 Drawing Sheets

HEADPHONE AMPLIFIER CIRCUIT

CROSS-REFERENCE TO RELATED APPLICATIONS

This application is a continuation of and claims priority to U.S. patent application Ser. No. 12/255,537 to Jinghua Ye et al., filed Oct. 21, 2008, entitled "HEADPHONE AMPLIFIER CIRCUIT," and which is herein incorporated by reference in its entirety.

BACKGROUND INFORMATION

The present invention relates generally to amplifier circuits and more specifically to headphone amplifier circuits in portable electronic devices.

In portable electronic devices, such as portable CD players and MP3 players, audio signals are amplified by headphone amplifiers. A headphone amplifier is typically externally biased by two power supplies to accurately represent incoming signals. However, portable electronic devices usually use a single power supply, e.g., a battery, as the only source of power. In a prior art headphone amplifier circuit shown in FIG. 1, headphone amplifiers 101 and 102 have their positive power supply terminals coupled to a positive power supply VDD and their negative power supply terminals coupled to ground, and consequently are biased at mid-rail (VDD/2). Since the output of the amplifiers 101 and 102 are at a higher DC voltage with respect to ground, relatively large capacitors 103 and 104 are required to prevent high currents from flowing through headphones. Such large capacitors make miniaturizing portable electronic devices difficult.

In another prior art headphone amplifier circuit shown in FIG. 2, amplifiers 201 and 202 have their positive power supply terminals coupled to VDD and their negative power supply terminals coupled to −VDD, and are biased at ground (0 volt) potential. Although large DC blocking capacitors are avoided, the amplifier circuit shown in FIG. 2 is a class AB amplifier, and has low power efficiency.

Another prior art approach is to use a class D amplifier, which has better power efficiency than a class AB amplifier, but high EMI (Electromagnetic interference), which can be a problem.

Therefore, it may be desirable to provide a headphone amplifier circuit which may help to conserve power and avoid audio clipping.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

DETAILED DESCRIPTION OF EXAMPLE EMBODIMENTS

Embodiments of the present invention provide a class G headphone amplifier circuit which has improved power efficiency and low EMI. Embodiments may use an automatic signal level detector to detect the signal level of incoming signals and dynamically adjust positive and negative power supplies for headphone amplifiers. A voltage generator may generate pairs of differential output voltages at variable amplitudes, and supply to headphone amplifiers an amplitude determined by the automatic signal level detector. As a result, headphone amplifiers receive power supplies at voltage levels that correspond to an input signal level which may improve power efficiency and avoid signal clipping.

Figure 3:
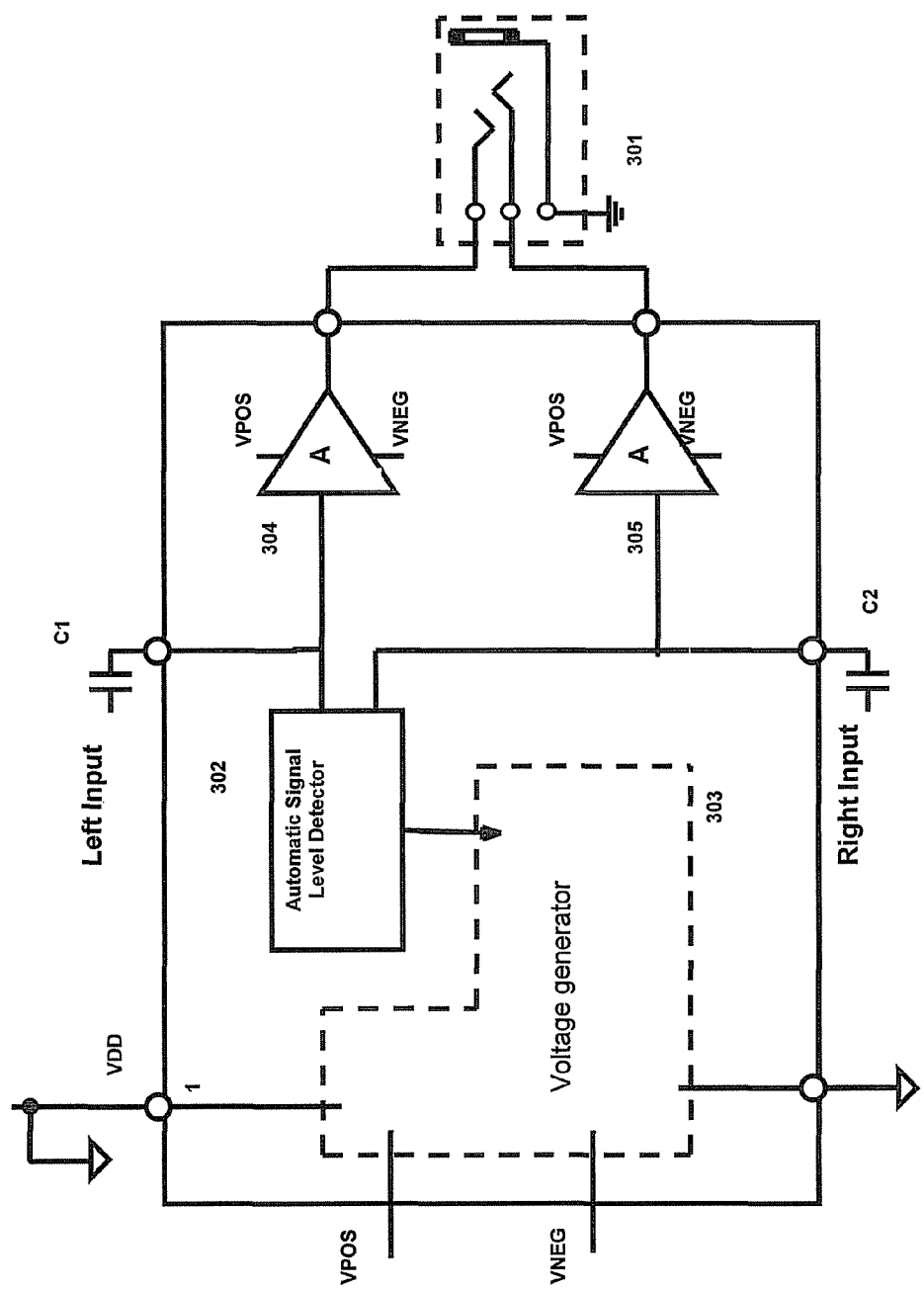
FIG. 3 illustrates a headphone amplifier circuit according to one embodiment of the present invention.

FIG. 3 illustrates a headphone amplifier circuit according to one embodiment of the present invention. The circuit 300 may include an automatic signal level detector 302, a voltage generator 303 and a pair of amplifiers 304, 305. The level detector 302 may compare input signals, which are to be amplified, to one or more voltage thresholds and may cause the voltage generator 303 to adjust output voltages VPOS and VNEG dynamically in response to this comparison. The output voltages VPOS and VNEG may be input to the amplifiers 304, 305 as power sources. In this manner, the circuit 300 tunes the supply power of the amplifiers 304, 305 to levels that are matched to the amplitude of the input signal and conserve energy.

Specifically, the headphone amplifier circuit may be coupled to a power supply VDD at a node 1, and may receive a left input signal via a capacitor C1 and a right input signal via a capacitor C2. An automatic signal level detector 302 may compare an input signal with a threshold VTH and, for the input signal, select a target (or reference) positive power supply VREFP and a target negative power supply VREFN (VREFP=−VREFN). In one embodiment, the automatic signal level detector 302 may compare the higher one of the left input signal and the right input signal with the threshold VTH1, and determine the amplitude of the positive and negative target power supplies. In one embodiment, the automatic signal level detector 302 may compare the input signal(s) to a plurality of thresholds; data regarding the thresholds and their corresponding target positive and negative power supplies may be stored in a memory, and the automatic signal level detector 302 may access the memory for the thresholds and target values.

The voltage generator 303 may be able to generate positive voltage output VPOS and negative voltage output VNEG at least two amplitude steps, and may bias headphone amplifiers 304 and 305 with voltages at the amplitude step determined by the automatic signal level detector 302.

The headphone amplifier 304 may receive the left input signal and the headphone amplifier 305 may receive the right input signal. Their second input may be coupled to a common ground and their output may be coupled to a left headphone speaker and a right headphone speaker respectively, which are represented collectively by a load 301. A headphone may be any listening device that fits in or around the ear.

Figure 4A:
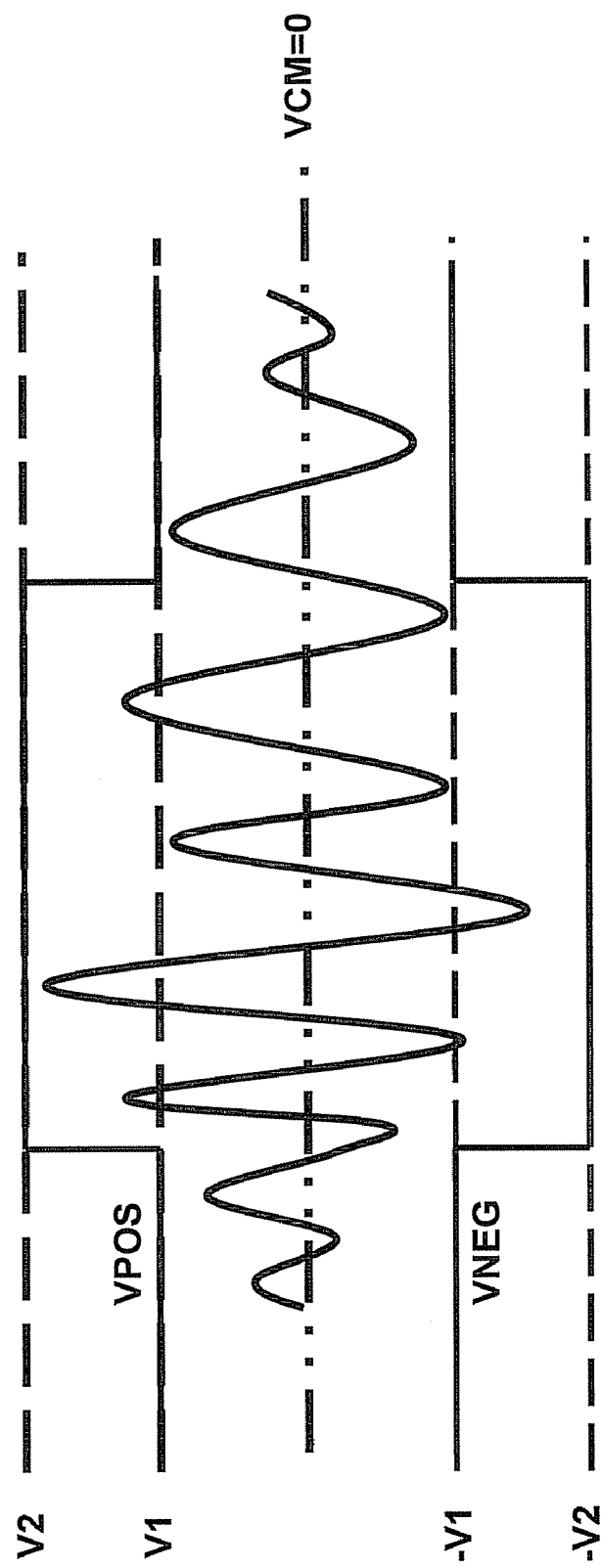
FIG. 4A illustrates waveforms of a two amplitude step power supply to headphone amplifiers according to one embodiment of the present invention.

FIG. 4A illustrates exemplary waveforms of a two amplitude step power supply to headphone amplifiers according to one embodiment of the present invention. The automatic signal level detector 302 may compare an input signal with a threshold VTH1. When the amplitude of the input signal does not exceed the threshold VTH1, the voltage generator 303 may work at a first mode or voltage amplitude step, so that VPOS=V1 and VNEG=−V1, wherein 0<V1<VDD. When the amplitude of the input signal exceeds the threshold VTH1, the voltage generator 303 may work at a second mode or voltage amplitude step, so that VPOS=V2 and VNEG=−V2, wherein V2>V1. In one embodiment, V1=VTH1, and V2=VDD.

Figure 4B:
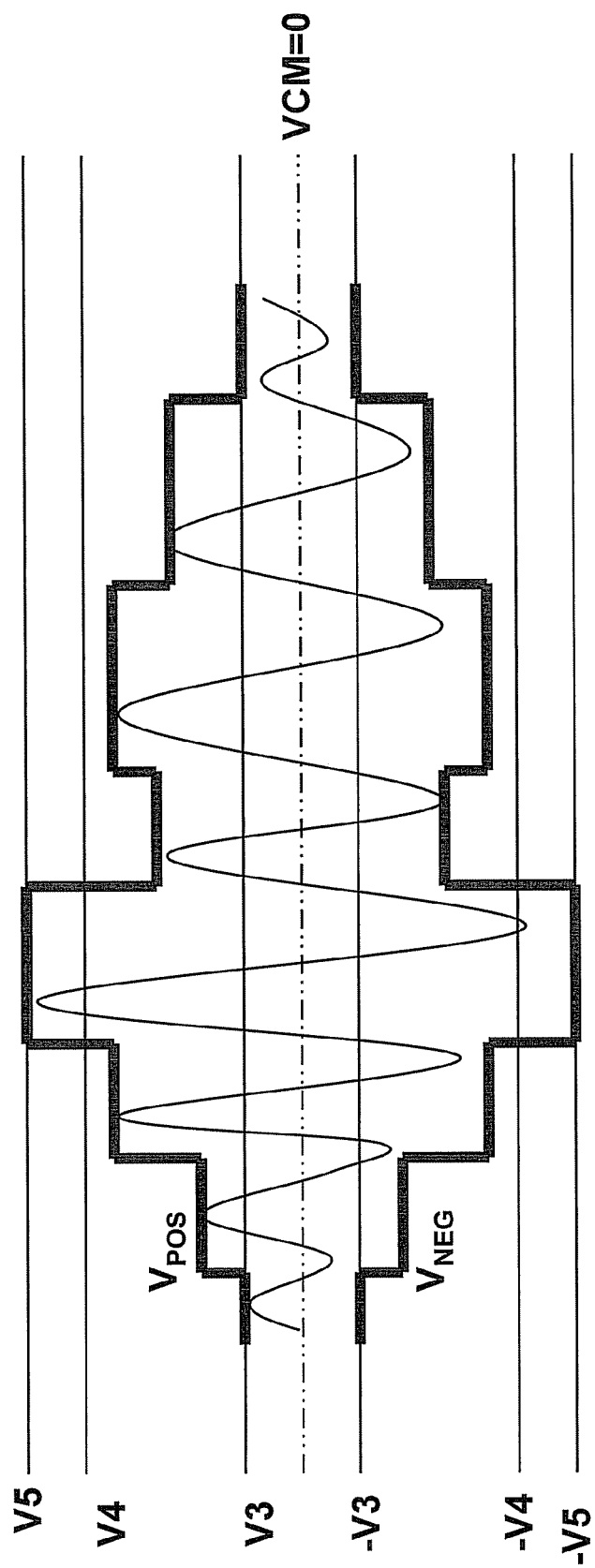
FIG. 4B illustrates waveforms of a three amplitude step power supply to headphone amplifiers according to one embodiment of the present invention.

FIG. 4B illustrates waveforms of a three amplitude step power supply to headphone amplifiers according to one embodiment of the present invention. The automatic signal level detector 302 may compare an input signal with a second threshold VTH2 and a third threshold VTH3, wherein 0<VTH2<VTH3. When the amplitude of the input signal does not exceed the threshold VTH2, the voltage generator 303 may work at a third mode or voltage amplitude step, so that VPOS=V3 and VNEG=−V3, wherein 0<V3<VDD. When the amplitude of the input signal is between VTH2 and VTH3, the voltage generator 303 may work at a fourth mode or voltage amplitude step, so that VPOS=V4 and VNEG=−V4, wherein 0<V3<V4<VDD. When the amplitude of the input signal exceeds the threshold VTH3, the voltage generator 303 may work at a fifth mode or voltage amplitude step, so that VPOS=V5 and VNEG=−V5, wherein 0<V3<V4<V5<VDD. In one embodiment, V3 =VTH2, V4 = VTH3, and V5=VDD. The headphone amplifier circuit may have as many voltage amplitude steps as necessary.

Figure 5:
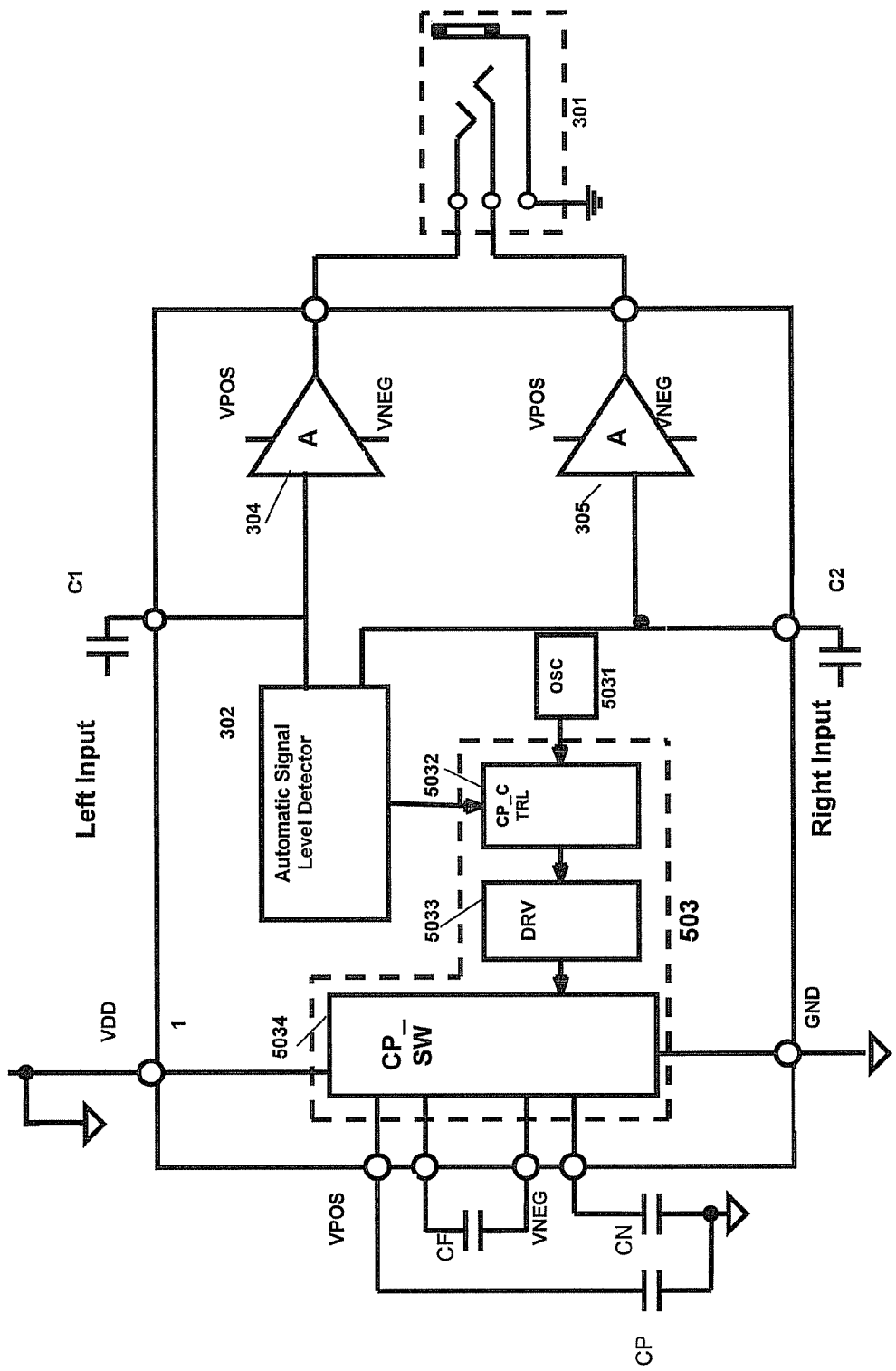
FIG. 5 illustrates a headphone amplifier circuit according to one embodiment of the present invention.

In an embodiment shown in FIG. 5, the voltage generator may be a charge pump 503. An oscillator 5031 may provide oscillating signals to a control logic 5032, which may receive the target positive power supply VREFP and target negative power supply VREFN directly or indirectly from the automatic signal level detector 302. A driving block 5033 may configure state of switches in a switch block 5034, so that the charge pump 503 may keep its output VPOS approximately at VREFP, and its output VNEG approximately at VREFN.

Figure 6:
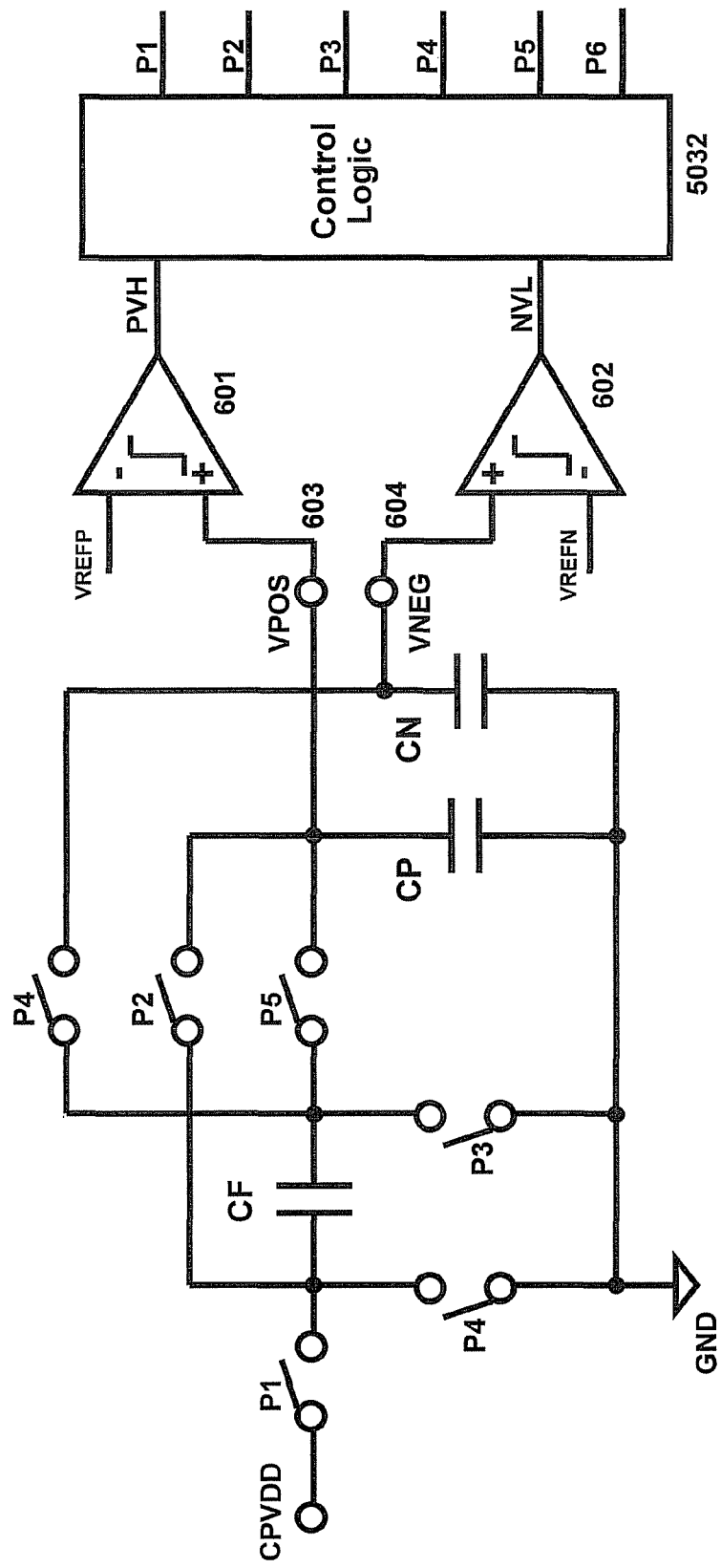
FIG. 6 illustrates the architecture of a charge pump used in a headphone amplifier circuit according to one embodiment of the present invention.

FIG. 6 illustrates in more detail the architecture of the charge pump in FIG. 5. The charge pump may receive an input voltage VDD at a terminal CPVDD and output a positive voltage VPOS and a negative voltage VNEG at output terminals 603 and 604 respectively. Voltages VPOS and VNEG are at two amplitude steps according to the determination made by the automatic signal level detector 302, e.g., VPOS=V1 and VNEG=−V1 if the amplitude of the incoming signal does not exceed the threshold VTH1, or VPOS=V2 and VNEG=−V2 if the amplitude of the incoming signal exceeds the threshold VTH1.

A flying capacitor CF may be charged by the voltage VDD and discharge via load capacitors CP or CN, depending on the state of switches P1-P6.

A comparator 601 may compare the positive voltage output VPOS and the target positive power supply VREFP and output a feedback control signal PVH to the control logic 5032. In one example, PVH=0 when VPOS<VREFP, and PVH=1 otherwise. Similarly, a comparator 602 may compare the negative voltage output VNEG and the target negative power supply VREFN and output a feedback control signal NVL to the control logic 5032. In one example, NVL=0 when VNEG is higher than VREFN (or its amplitude is smaller than that of VREFN) and NVL=1 otherwise. The values of VREFP and VREFN may be provided by the automatic signal level detector 302, or provided by a memory device according to a control signal from the automatic signal level detector 302.

In response to the feedback control signals PVH and NVL from comparators 601 and 602, the control logic 5032 may change the state of switches P1-P6 and consequently the operating state of the charge pump to keep its positive voltage output VPOS close to VREFP and its negative voltage output VNEG close to VREFN.

Figure 7:
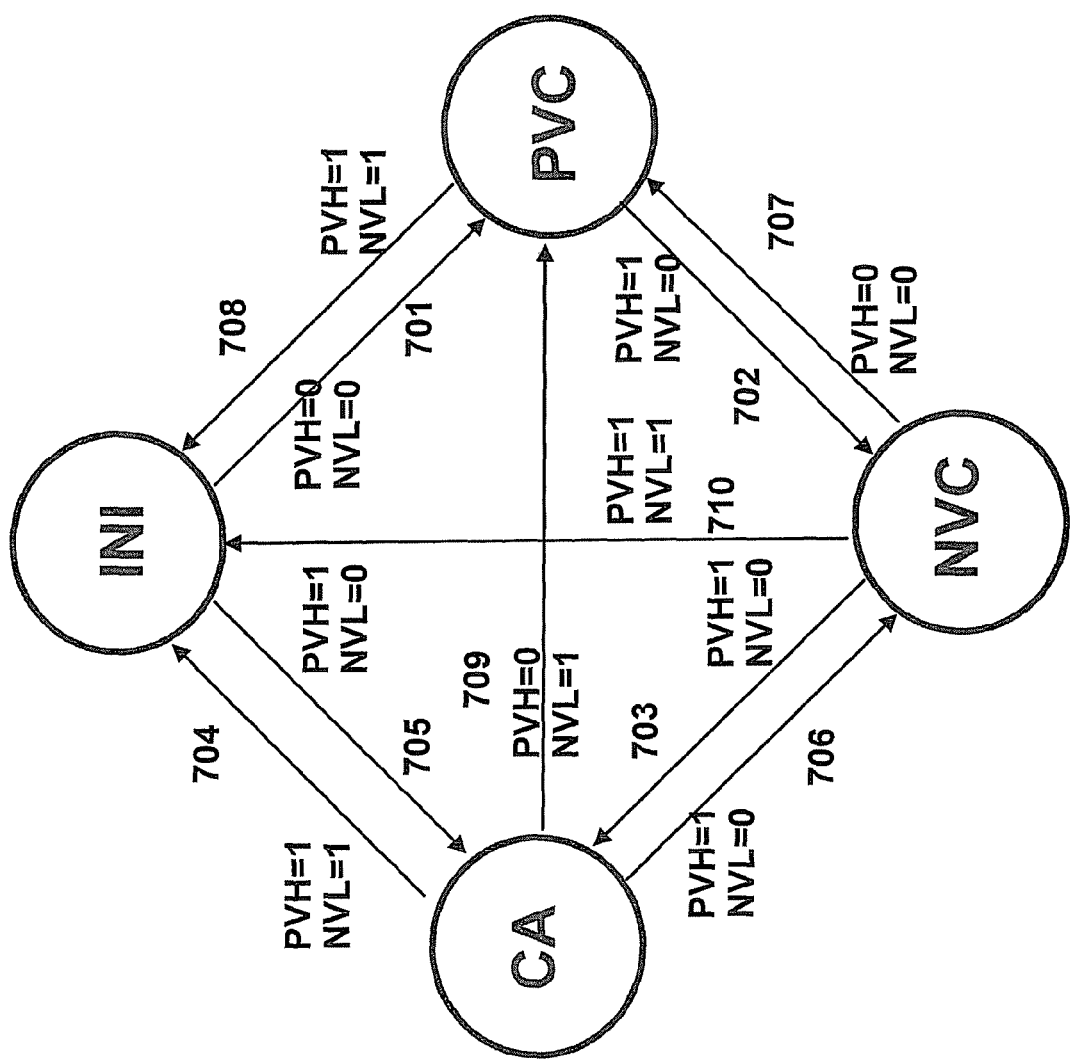
FIG. 7 illustrates a finite state machine (FSM) of a charge pump used in a headphone amplifier circuit according to one embodiment of the present invention.
Figure 8A:
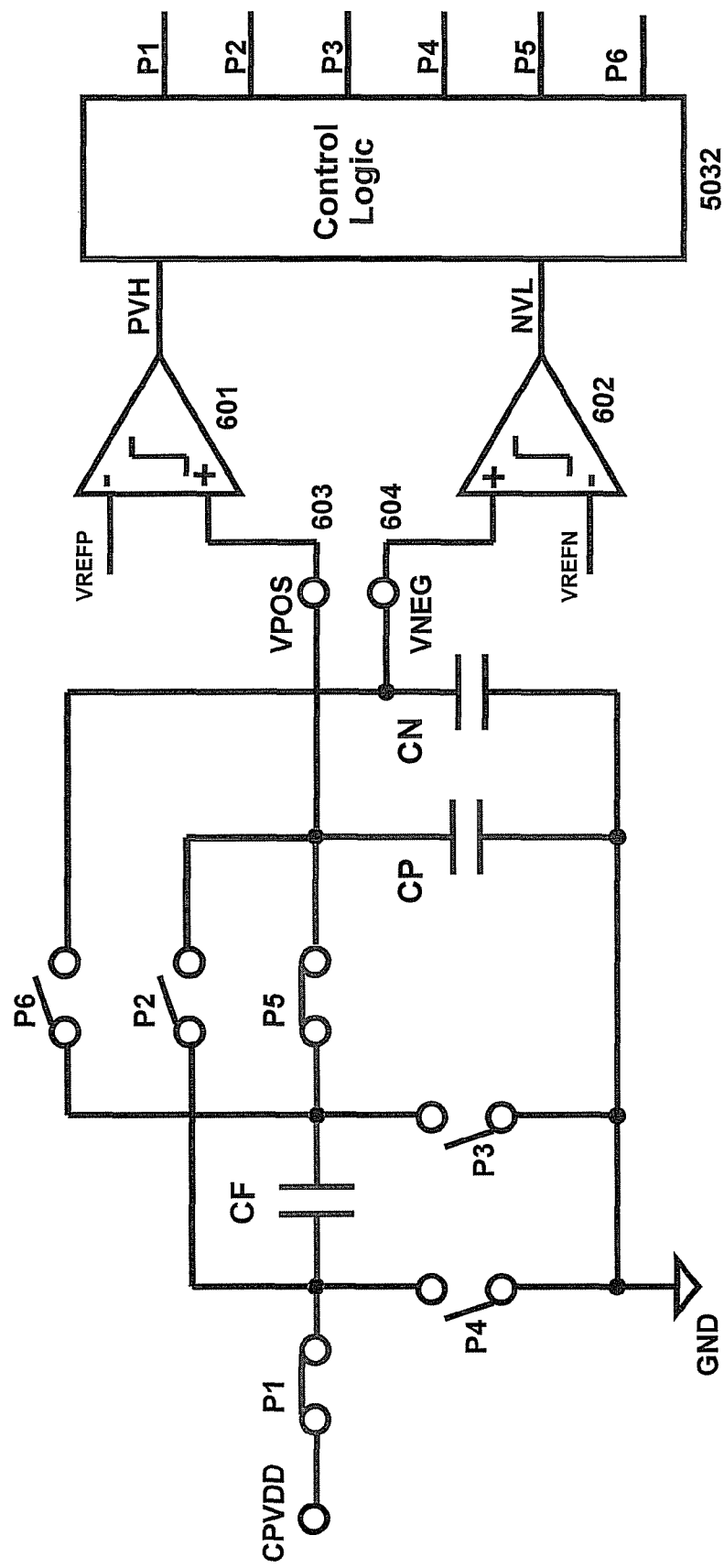
FIGS. 8A-8C illustrate circuit diagrams of a charge pump at various operating states according to one embodiment of the present invention.
Figure 8B:
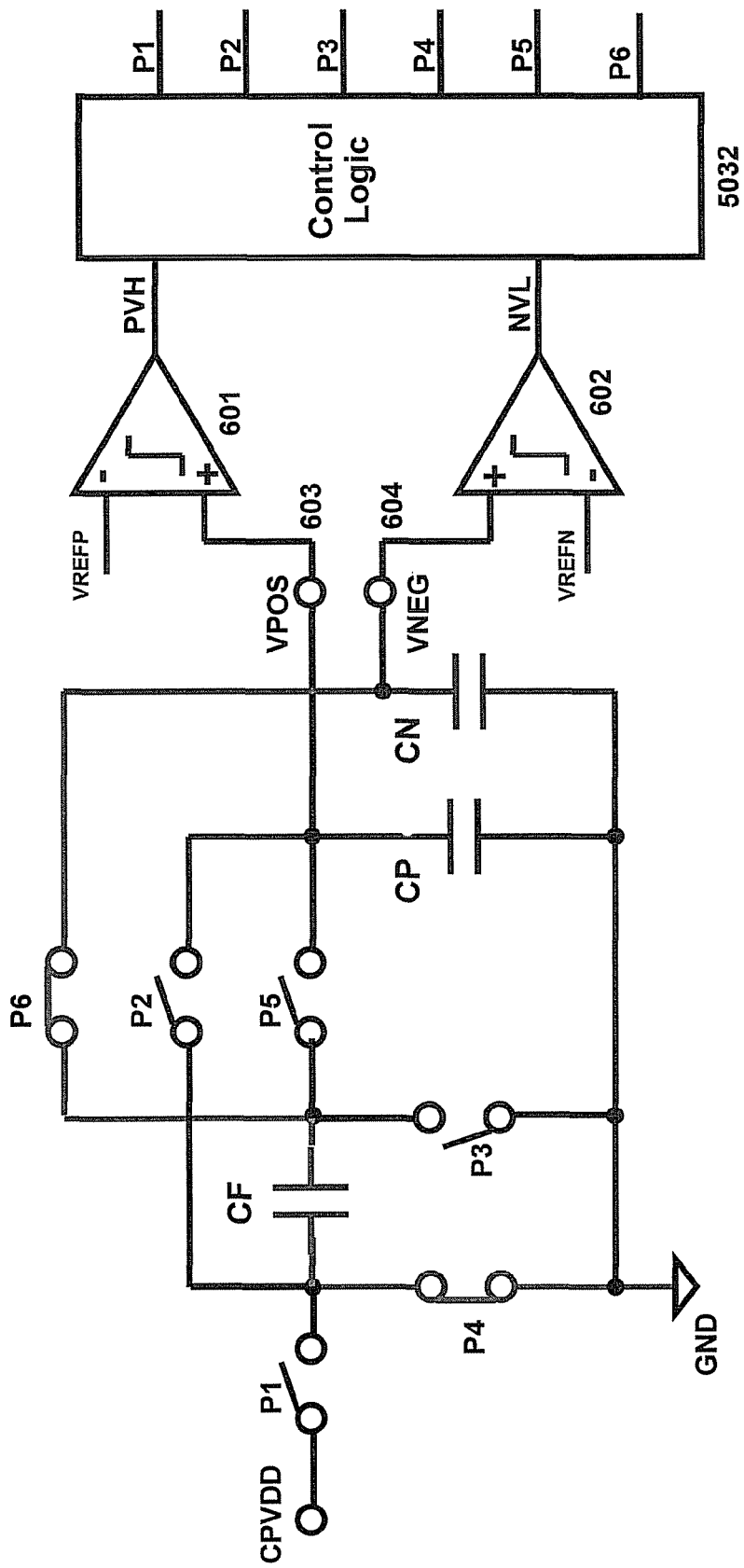
Figure 8C:
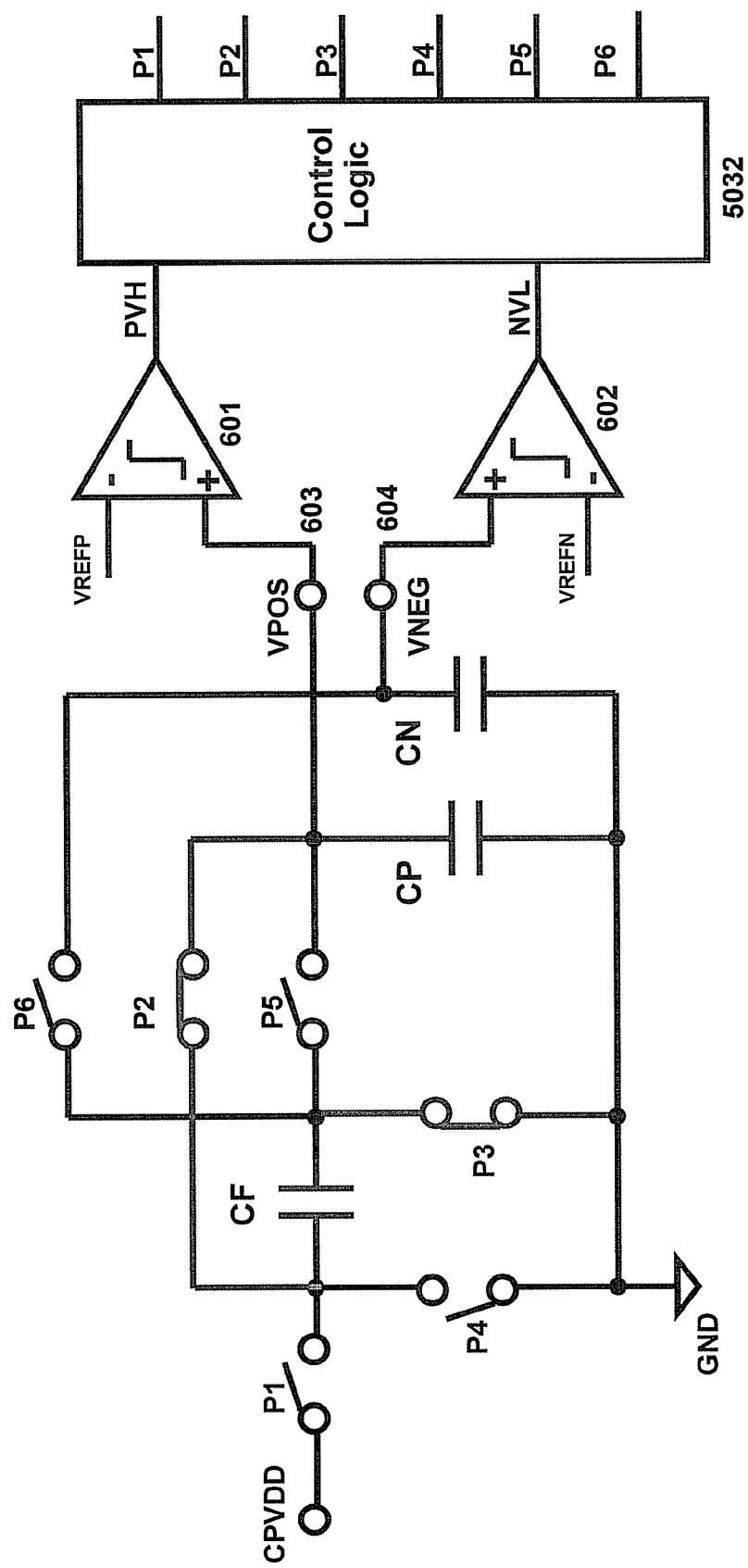

FIG. 7 illustrates a finite state machine (FSM) of the charge pump in FIG. 6 in the first work mode, providing voltages ± V1 at the first amplitude step as shown in FIG. 4. FIGS. 8A-8C illustrate circuit diagrams of the charge pump in FIG. 6 at various operating states according to one embodiment of the present invention. The VREFP in FIG. 6 may be set to V1, and the VREFN in FIG. 6 may be set to −V1. The charge pump may change among four operating states: an initial state (INI), a positive voltage charging state (PVC), a negative voltage charging state (NVC) and a charge averaging state (CA) according to the state of switches P1-P6.

At the initial state (INI), all switches may be turned off, as shown in FIG. 6. VPOS is close to V1 and VNEG is close to −V1.

At the positive voltage charging state (PVC), switches P1 and P5 may be turned on, as shown in FIG. 8A, so that the input voltage VDD may charge the load capacitor CP to increase the value of VPOS to approximately V1 .

At the negative voltage charging state (NVC), switches P4 and P6 may be turned on, as shown in FIG. 8B, so that the load capacitor CN may be negatively charged and VNEG may be lowered to approximately −V1 .

At the charge averaging state (CA), switches P2 and P3 may be turned on, as shown in FIG. 8C, so that charge may be averaged between the flying capacitor CF and the load capacitor CP.

When the charge pump is at the INI operating state, if both PVH and NVL change to 0, the control logic 5032 may perform a transition 701, changing state of the switches (i.e., only keep P1 and P5 switched on) and consequently changing the charge pump to the PVC state to increase VPOS to approximately V1 .

When the charge pump is at the PVC operating state, if PVH is 1 but NVL is 0, the control logic 5032 may perform a transition 702, changing state of the switches (i.e., only keep P4 and P6 switched on) and consequently changing the charge pump to the NVC state to lower the VNEG to approximately −V1 .

When the charge pump is at the NVC operating state, if PVH is 1 but NVL is 0, the control logic 5032 may perform a transition 703, changing state of the switches (i.e., only keep P2 and P3 switched on) and consequently changing the charge pump to the CA state.

When the charge pump is at the CA operating state, if both PVH and NVL change to 1, the control logic 5032 may perform a transition 704, changing state of the switches (i.e., turn off all switches) and consequently changing the charge pump to the INI state to keep VPOS close to V1 and keep VNEG close to −V1.

When the charge pump is at the INI operating state, if PVH is 1 but NVL is 0, the control logic 5032 may perform a transition 705, changing state of the switches (i.e., only keep P2 and P3 switched on) and consequently changing the charge pump to the CA state.

When the charge pump is at the CA operating state, if PVH is 1 but NVL is 0, the control logic 5032 may perform a transition 706, changing state of the switches (i.e., only keep P4 and P6 switched on) and consequently changing the charge pump to the NVC state to lower the VNEG to approximately −V1.

When the charge pump is at the NVC operating state, if both PVH and NVL change to 0, the control logic 5032 may perform a transition 707, changing state of the switches (i.e., only keep P1 and P5 switched on) and consequently changing the charge pump to the PVC state to increase VPOS to approximately V1.

When the charge pump is at the PVC operating state, if both PVH and NVL change to 1, the control logic 5032 may perform a transition 708, changing state of the switches (i.e., turn off all switches) and consequently changing the charge pump to the INI state to keep VPOS close to V1 and keep VNEG close to −V1.

When the charge pump is at the CA operating state, if PVH is 0 and NVL is 1, the control logic 5032 may perform a transition 709, changing state of the switches (i.e., only keep P1 and P5 switched on) and consequently changing the charge pump to the PVC state to increase VPOS to approximately V1.

When the charge pump is at the NVC operating state, if both PVH and NVL are 1, the control logic 5032 may perform a transition 710, changing state of the switches (i.e., turn off all switches) and consequently changing the charge pump to the INI state to keep VPOS close to V1 and keep VNEG close to −V1.

Figure 9:
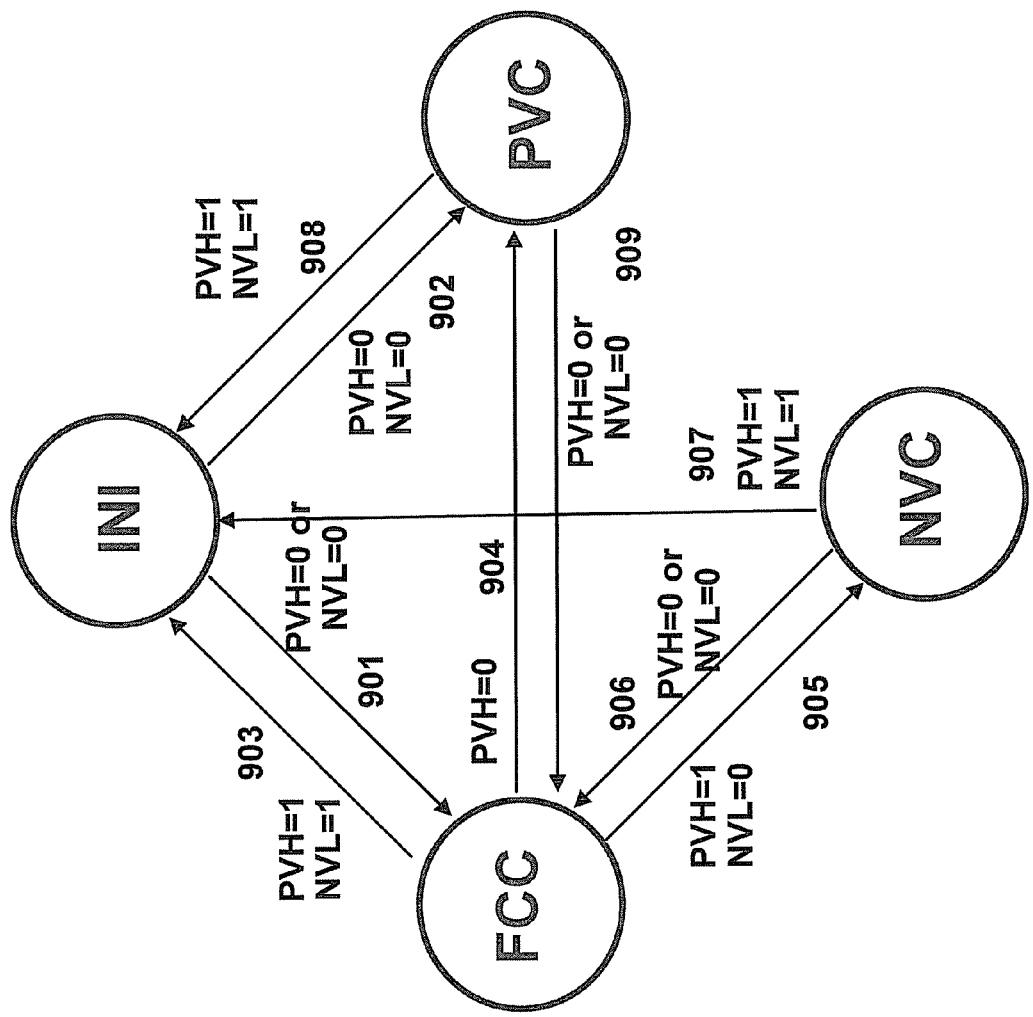
FIG. 9 illustrates a finite state machine (FSM) of a charge pump used in a headphone amplifier circuit according to one embodiment of the present invention.
Figure 10A:
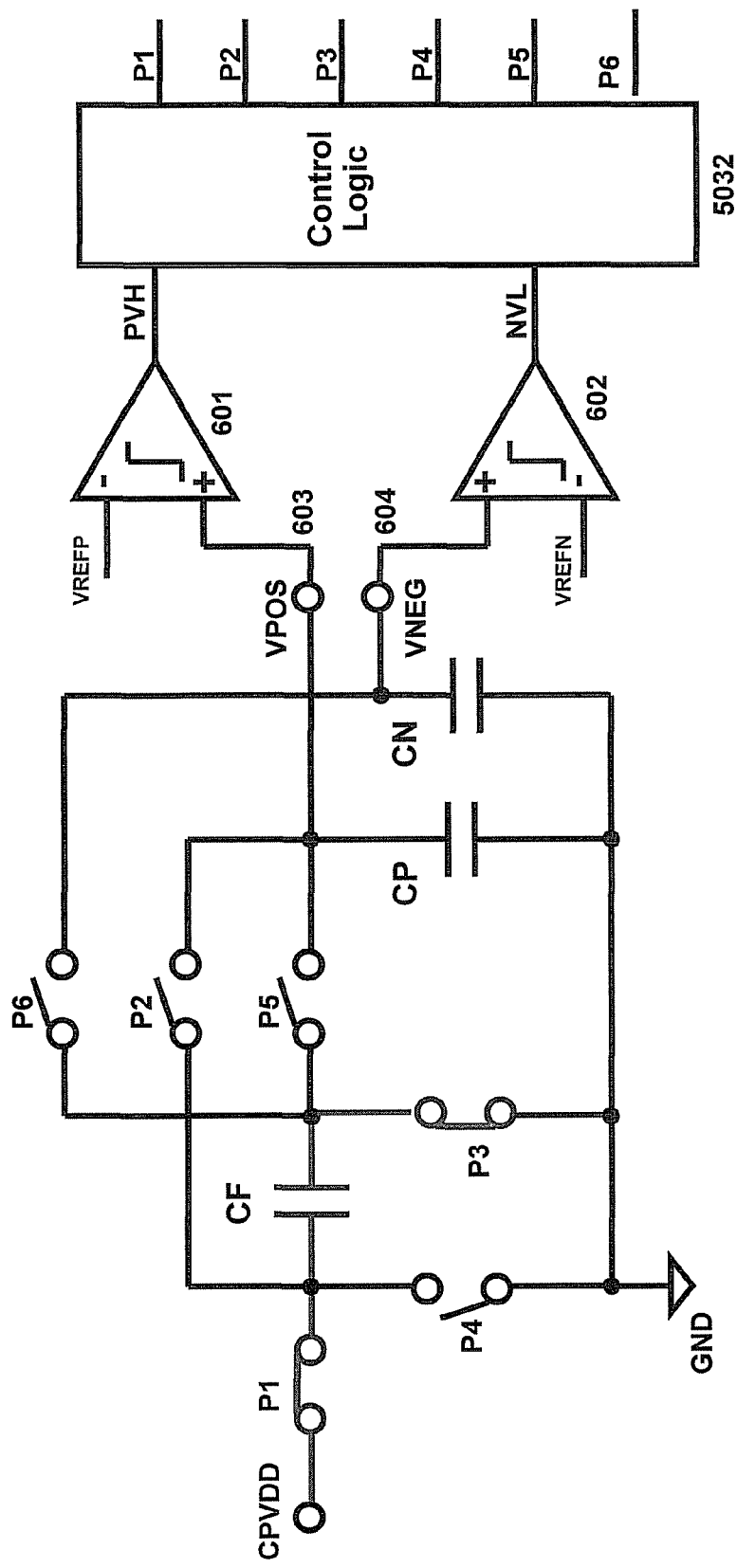
FIGS. 10A-10C illustrate circuit diagrams of a charge pump at various operating states according to one embodiment of the present invention.
Figure 10B:
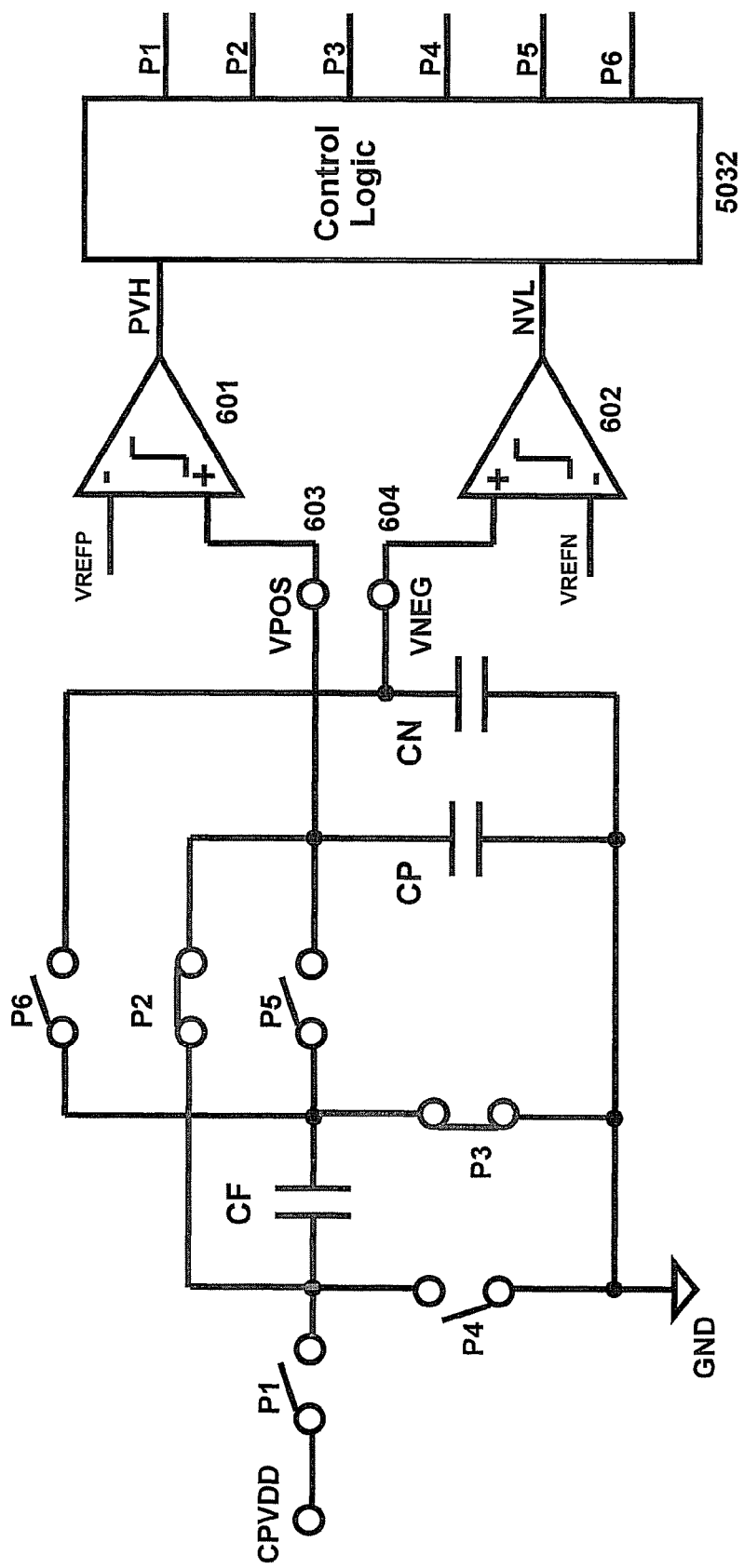
Figure 10C:
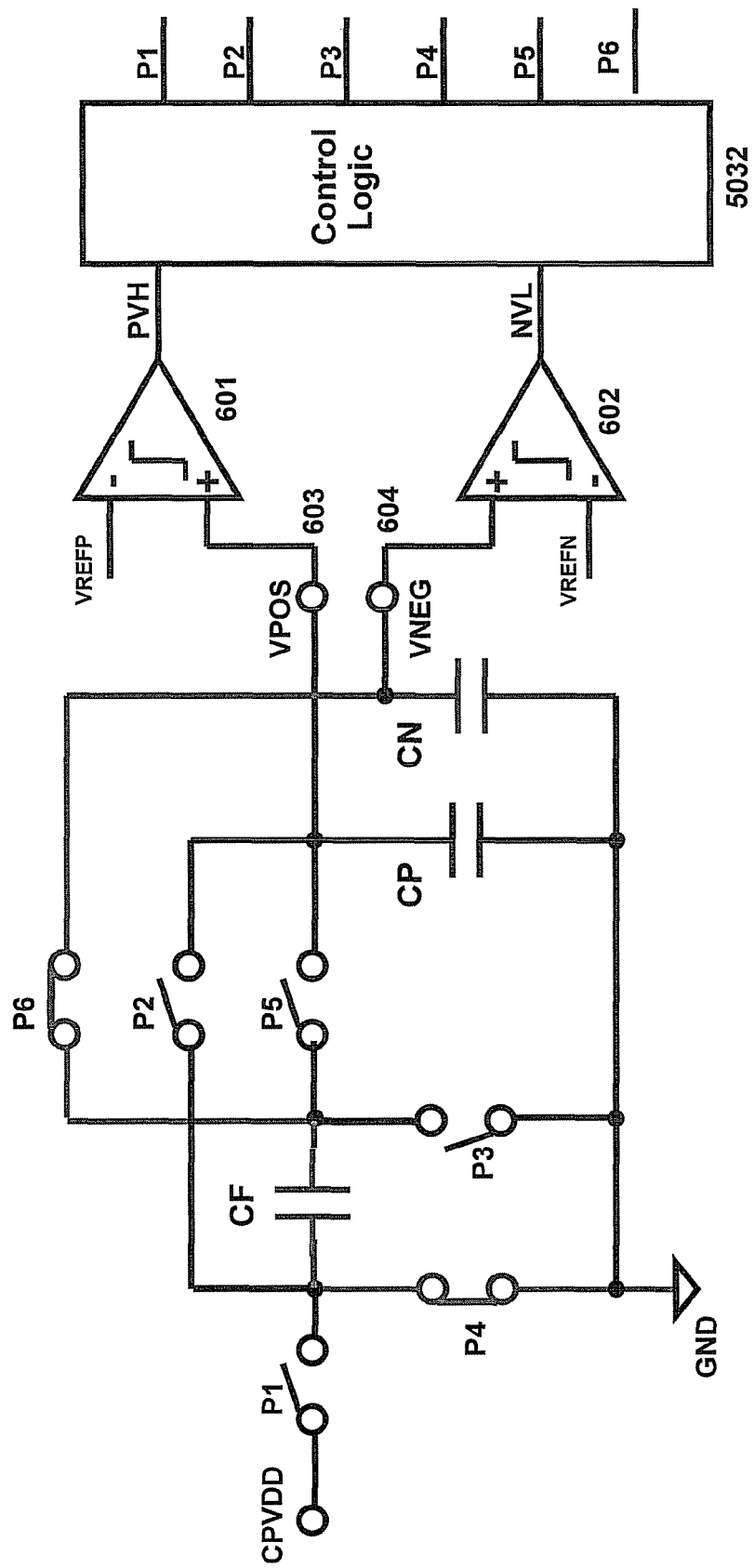

FIG. 9 illustrates a finite state machine (FSM) of the charge pump in FIG. 6 in the second work mode, providing voltages ±V2 at the second amplitude step as shown in FIG. 4A. FIGS. 10A-10C illustrate circuit diagrams of the charge pump in FIG. 6 at various operating states according to one embodiment of the present invention. When the signal level detector 302 determines that the amplitude of the incoming signal exceeds the threshold VTH1, the charge pump may change from the first work mode to the second mode. Consequently, the VREFP may be set to V2, and the VREFN may be set to −V2.

The charge pump may change among four operating states: the initial state (INI), a positive voltage charging state (PVC), a negative voltage charging state (NVC) and a flying capacitor charging state (FCC) according to the state of the switches P1-P6.

At the initial operating state (INI), all switches may be turned off, as shown in FIG. 6. VPOS is close to V2, and VNEG is close to −V2.

At the flying capacitor charging state (FCC), switches P1 and P3 may be turned on, as shown in FIG. 10A, so that the input voltage VDD may charge the flying capacitor CF.

At the positive voltage charging state (PVC), switches P2 and P3 may be turned on, as shown in FIG. 10B, so that the flying capacitor CF may charge the load capacitor CP to increase the value of VPOS to approximately V2.

At the negative voltage charging state (NVC), switches P4 and P6 may be turned on, as shown in FIG. 10C, so that the load capacitor CN may be negatively charged and VNEG may be lowered to approximately −V2.

When the charge pump is at the INI operating state, if either PVH or NVL changes to 0, the control logic 5032 may perform a transition 901, changing state of the switches (i.e., only keep P1 and P3 switched on) and consequently changing the charge pump to the FCC state to charge the flying capacitor CF.

When the charge pump is at the INI operating state, if both PVH and NVL are 0, the control logic 5032 may perform a transition 902, changing state of the switches (i.e., only keep P2 and P3 switched on) and consequently changing the charge pump to the PVC state to increase the value of VPOS to approximately V2.

When the charge pump is at the FCC operating state, if both PVH and NVL are 1, the control logic 5032 may perform a transition 903, changing state of the switches (i.e., turn off all switches) and consequently changing the charge pump to the INI state to keep VPOS close to V2 and VNEG close to −V2.

When the charge pump is at the FCC operating state, if PVH is 0, the control logic 5032 may perform a transition 904, changing state of the switches (i.e., only keep P2 and P3 switched on) and consequently changing the charge pump to the PVC state to increase the value of VPOS to approximately V2.

When the charge pump is at the FCC operating state, if PVH=1 and NVL=0, the control logic 5032 may perform a transition 905, changing state of the switches (i.e., only keep P4 and P6 switched on) and consequently changing the charge pump to the NVC state to decrease VNEG to approximately −V2.

When the charge pump is at the NVC operating state, if either PVH or NVL changes to 0, the control logic 5032 may perform a transition 906, changing state of the switches (i.e., only keep P1 and P3 switched on) and consequently changing the charge pump to the FCC state to charge the flying capacitor CF.

When the charge pump is at the NVC operating state, if both PVH and NVL are 1, the control logic 5032 may perform a transition 907, changing state of the switches (i.e., turn off all switches) and consequently changing the charge pump to the INI state to keep VPOS close to V2 and VNEG close to −V2.

When the charge pump is at the PVC operating state, if both PVH and NVL are 1, the control logic 5032 may perform a transition 908, changing state of the switches (i.e., turn off all switches) and consequently changing the charge pump to the INI state to keep VPOS close to V2 and VNEG close to −V2.

When the charge pump is at the PVC operating state, if either PVH or NVL changes to 0, the control logic 5032 may perform a transition 909, changing state of the switches (i.e., only keep P1 and P3 switched on) and consequently changing the charge pump to the FCC state to charge the flying capacitor.

FIGS. 7 and 9 are two embodiments of the present invention only, and are not intended to limit the sequence of the transitions. The charge pump may start at any work mode or operating state, and perform any transitions as long as conditions of that transition are met.

For the sake of clarity, the charge pump in FIGS. 6-10 are described with a two amplitude step headphone amplifier circuit, although the charge pump may be used with headphone amplifier circuits with more amplitude steps. The charge pump may change to a different work mode or voltage amplitude step when VREFP and VREFN are changed. For example, for the three amplitude step power supply to headphone amplifiers shown in FIG. 4B, at the third work mode, VREFP may be set to V3 and VREFN may be set to −V3. At the fourth work mode, VREFP may be set to V4 and VREFN may be set to −V4. At the fifth work mode, VREFP may be set to V5 and VREFN may be set to −V5. At each work mode, the control logic 5032 may turn on and off switches P1-P6 according to an FSM for that mode, so as to change operating state of the charge pump to keep VPOS close to VREFP and VNEG close to VREFN.

Figure 11:
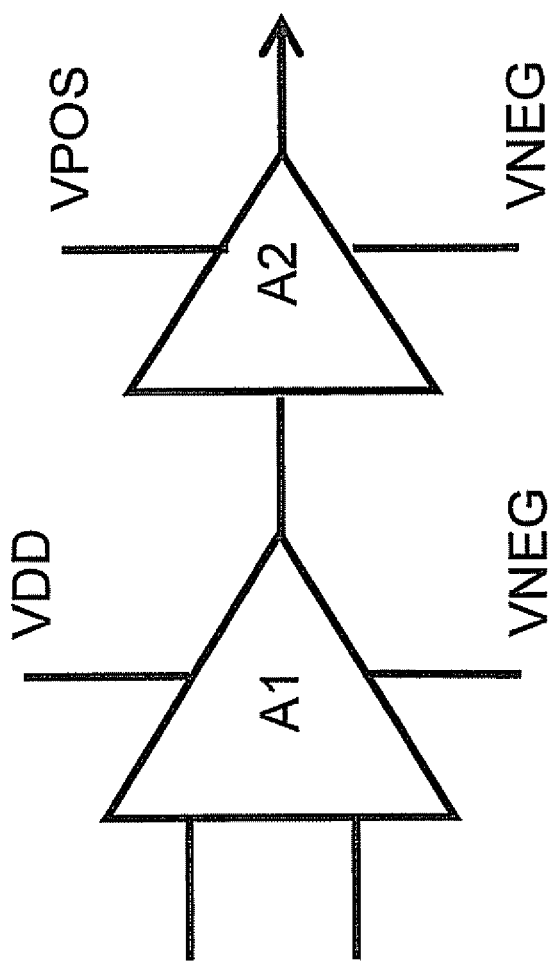
FIG. 11 illustrates a headphone amplifier according to one embodiment of the present invention.

FIG. 11 illustrates a headphone amplifier according to one embodiment of the present invention. As shown, the headphone amplifier 304 or 305 may have a first stage and a second stage. The first stage A1 may be powered by VDD and VNEG, and the second stage A2 may be powered by VPOS and VNEG.

Further embodiments are also possible. For example, in addition to a charge pump, other devices capable of generating positive and negative voltages at multiple amplitude steps may be used as the voltage generator 303 as well.

Figure 12:
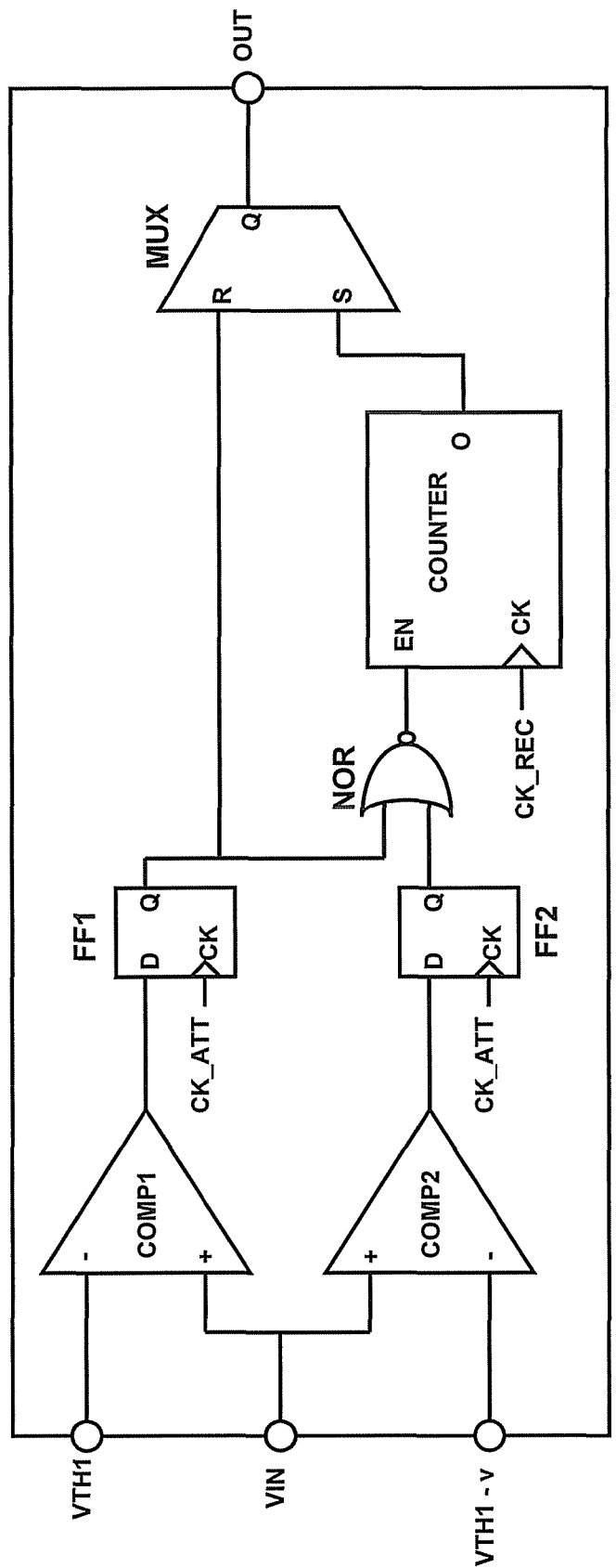
FIG. 12 illustrates a response speed controller for a signal level detector according to one embodiment of the present invention.

FIG. 12 illustrates a response speed controller for a signal level detector according to one embodiment of the present invention. The response speed controller may set the signal level detector to work at a fast response speed when incoming signals are higher than a predetermined value to prevent clipping, and at a slower response speed when incoming signals are lower than the predetermined value to conserve battery power.

In one embodiment, a fast response speed may be set as the default, and may be changed to a slower speed when incoming signals are lower than a predetermined value for a predetermined period of time. As shown, incoming signals may be compared at a comparator COMP1 with a threshold VTH1, which is used to determine voltages VPOS and VNEG; and compared at a comparator COMP2 with a predetermined value VTH1−v, which is used to determine the response speed of the signal level detector, wherein VTH1>VTH1−v.

For an incoming signal VIN>VTH1>VTH1−v, the output of the comparator COMP1 is high, and the output terminal Q of a flip-flop FF1 is kept high. At the same time, the output terminal of a flip-flop FF2 is also kept high. Consequently, the output of a NOR gate is low and cannot trigger a counter coupled at its output, and a multiplexer MUX may keep the response speed of the signal level detector at the fast speed.

When an incoming signal is between VTH1 and VTH1−v, the output of the comparator COMP1 is low. Since the output of the comparator COMP2 is high, the output of the NOR gate is still low and cannot trigger the counter to change the response speed.

For an incoming signal VIN<VTH1−v <VTH1, the output of the NOR gate is high and the counter may be triggered. If the output of the NOR gate is high for a predetermined period of time, e.g., 30 ms, the counter's output may turn high and trigger the multiplexer MUX to change the response speed to a slower one.

Figure 13:
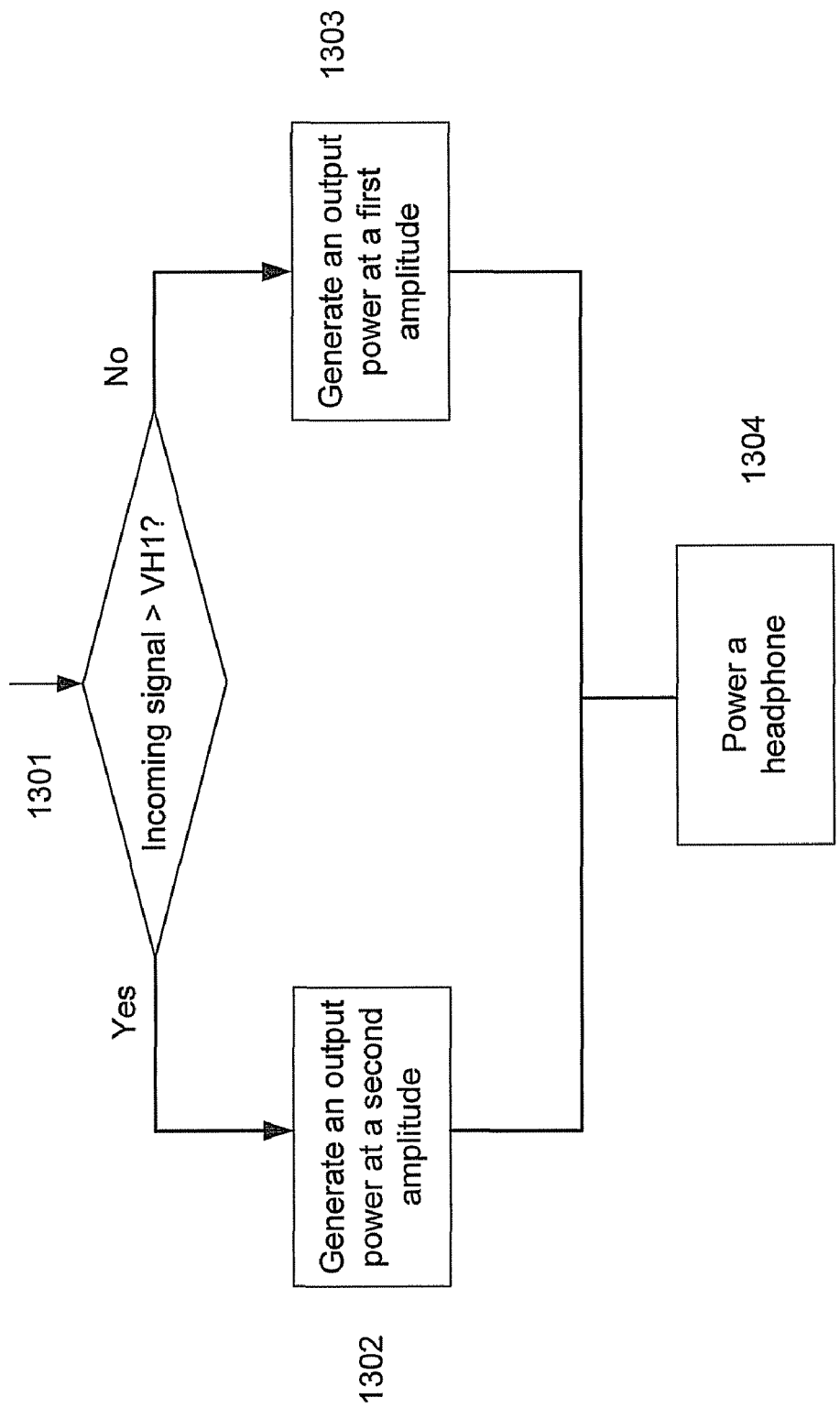
FIG. 13 is a flowchart of a method for powering a headphone amplifier according to one embodiment of the present invention.

FIG. 13 is a flowchart of a method for powering a headphone amplifier according to one embodiment of the present invention. The method may be used in the headphone amplifier circuit in FIG. 3 to generate voltages VPOS and VNEG shown in FIG. 4A. As shown, at 1301, the signal level detector 302 may detect whether an incoming signal exceeds the threshold VH1.

If the incoming signal exceeds VH1, at 1302, the voltage generator 303 may generate voltages VPOS and VNEG at a bigger amplitude, e.g., VPOS=V2 and VNEG=−V2.

If the incoming signal does not exceed VH1, at 1303, the voltage generator 303 may generate voltages VPOS and VNEG at a smaller amplitude, e.g., VPOS=V1 and VNEG=−V1.

At 1304, voltages VPOS and VNEG may be used to power amplifiers 304 and 305.

Figure 1:
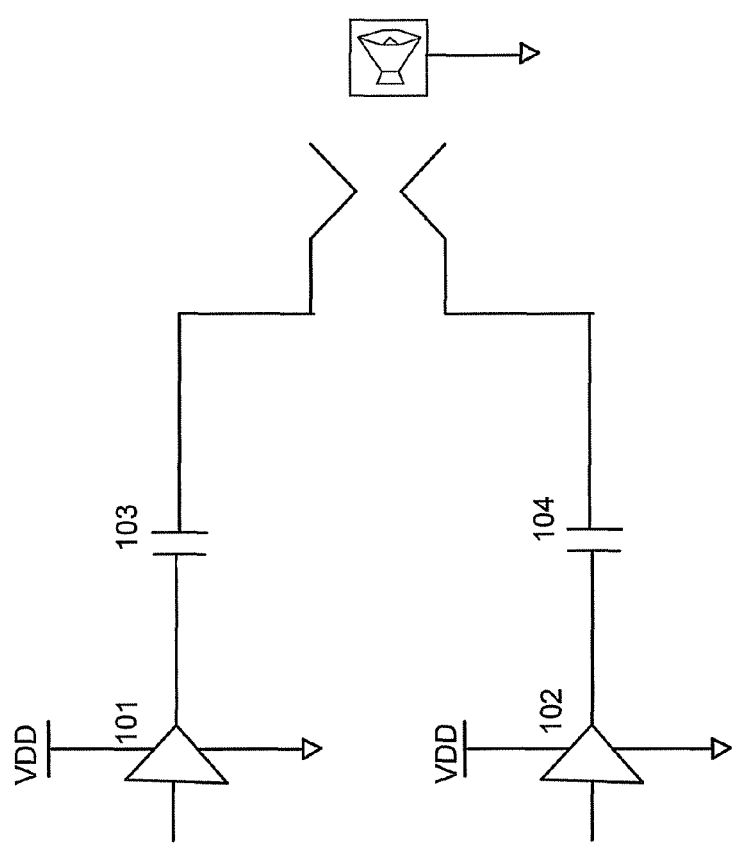
FIG. 1 illustrates a prior art headphone amplifier circuit.
Figure 2:
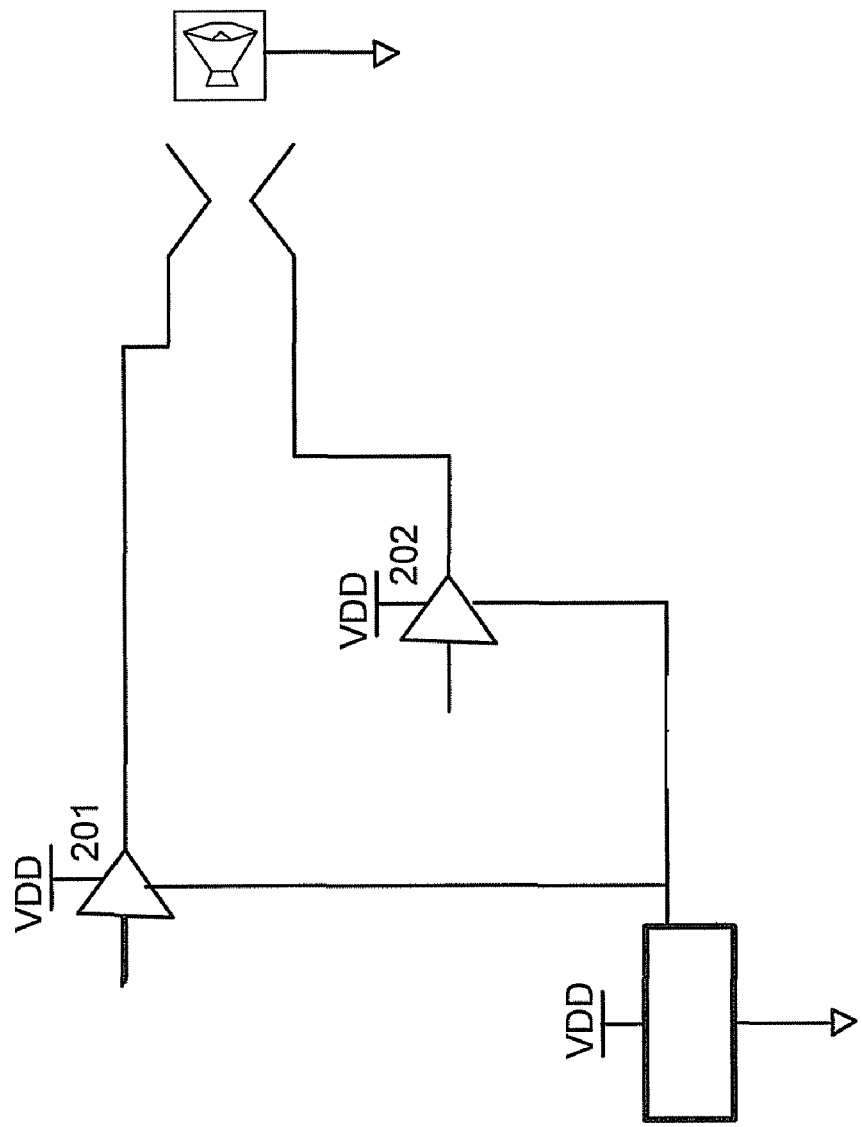
FIG. 2 illustrates another prior art headphone amplifier circuit.

Thus, large DC blocking capacitors required in the prior art circuit shown in FIG. 1 are avoided. In addition, since power supplies for headphone amplifiers 304 and 305 are selected according to the incoming signal level, instead of always using the full VDD as the prior art headphone amplifier circuit in FIG. 2 does, the headphone amplifier circuit of the present invention is more power efficient.

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure. Therefore, it is intended that the invention be considered as limited only by the scope of the appended claims.

What is claimed is:

1. An amplifier circuit, comprising:
   a signal level detector, comparing an incoming audio signal with a first threshold and providing a first control signal when the incoming audio signal exceeds the first threshold and a second control signal when the incoming audio signal does not exceed the first threshold;
   a voltage generator, coupled to the signal level detector and generating a positive output voltage at a first amplitude when receiving the first control signal and a positive output voltage at a second amplitude when receiving the second control signal; and
   an amplifier, receiving at a positive power supply terminal the positive output voltage from the voltage generator.

2. The amplifier circuit of claim 1, wherein the amplifier comprises a first stage and a second stage and the second stage receives the positive voltage output.

3. The amplifier circuit of claim 1, wherein when the incoming audio signal has two or more components, the component with the biggest amplitude is compared with the first threshold.

4. A headphone amplifier circuit comprising the amplifier circuit of claim 1.

5. A portable electronic device comprising the amplifier circuit of claim 1.

6. A method for powering a headphone amplifier, comprising:
   comparing an incoming audio signal with a first threshold and providing a first control signal when the incoming audio signal exceeds the first threshold and a second control signal when the incoming audio signal does not exceed the first threshold;
   generating a positive output voltage at a first amplitude in response to the first control signal and a positive output voltage at a second amplitude in response to the second control; and
   powering an amplifier with the positive output voltage.

7. The method of claim 6, wherein when the incoming audio signal has two or more components, the component with the biggest amplitude is compared with the first threshold.

8. A method for powering a headphone amplifier, comprising:
- comparing the incoming audio signal with a first threshold and providing a first control signal when the incoming audio signal exceeds the first threshold and a second control signal when the incoming audio signal does not exceed the first threshold;
- generating a positive output voltage at a amplitude in response to the first control signal and a positive output voltage at a second amplitude in response to the second control;
- powering an amplifier with the positive output voltage; and
- comparing the incoming audio signal with a predetermined value, and setting the signal level detector to work at a fast response speed when the incoming signal exceeds the predetermined value.

9. An amplifier circuit, comprising:
- a signal level detector, comparing an incoming audio signal with a first threshold and providing a first control signal when the incoming audio signal exceeds the first threshold and a second control signal when the incoming audio signal does not exceed the first threshold;
- a voltage generator, coupled to the signal level detector and generating a positive output voltage at a first amplitude when receiving the first control signal and a positive output voltage at a second amplitude when receiving the second control signal; and
- an amplifier, receiving at a positive power supply terminal the positive output voltage from the voltage generator,
- wherein the signal level detector compares the incoming audio signal with a second threshold and providing a third control signal when the incoming audio signal exceeds the second threshold and a fourth control signal when the incoming audio signal does not exceed the second threshold.

10. The circuit of claim 9, wherein the voltage generator generates a positive output voltage at a third amplitude when receiving the third control signal and a positive output voltage at a fourth amplitude when receiving the fourth control signal.

11. An amplifier circuit, comprising:
- a signal level detector, comparing an incoming signal with a first threshold and providing a first control signal when the incoming signal exceeds the first threshold and a second control signal when the incoming signal does not exceeds the first threshold;
- a voltage generator, coupled to the signal level detector and generating a positive output voltage at a first amplitude when receiving the first control signal and a positive output voltage at a second amplitude when receiving the second control signal; and
- an amplifier, receiving at a positive power supply terminal the positive output voltage from the voltage generator,
- wherein the incoming signal has two or more components, the component with the biggest amplitude is compared with the first threshold.

12. A method for powering a headphone amplifier, comprising:
- comparing an audio incoming signal with a first threshold and providing a first control signal when the incoming audio signal exceeds the first threshold and a second control signal when the incoming audio signal does not exceed the first threshold;
- comparing the incoming signal with a predetermined value, and setting the signal level detector to work at a fast response speed when the incoming signal exceeds the predetermined value;
- generating a positive output voltage at a first amplitude in response to the first control signal and a positive output voltage at a second amplitude in response to the second control; and
- powering an amplifier with the positive output voltage,
- wherein the incoming signal has two or more components, the component with the biggest amplitude is compared with the first threshold.

* * * * *